United States Patent
Shimamura

[19]

[11] Patent Number: 5,949,305
[45] Date of Patent: Sep. 7, 1999

[54] SAW FILTER ENCAPSULATED IN A CERAMIC PACKAGE WITH CAPACITANCE INCORPORATED THEREIN

[75] Inventor: Hajime Shimamura, Tokyo, Japan

[73] Assignee: Oki Electric Industry Co., Ltd., Tokyo, Japan

[21] Appl. No.: 08/798,165

[22] Filed: Feb. 10, 1997

[30] Foreign Application Priority Data

Feb. 28, 1996 [JP] Japan .................................. 8-041194

[51] Int. Cl.$^6$ ............................................. H03H 9/64
[52] U.S. Cl. .................... 333/193; 333/196; 310/349
[58] Field of Search ................... 333/193–196; 310/313 R, 313 B, 313 C, 313 D, 340, 344, 348, 349, 350

[56] References Cited

U.S. PATENT DOCUMENTS

| | | | |
|---|---|---|---|
| 5,252,882 | 10/1993 | Yatsuda | 310/313 R |
| 5,281,883 | 1/1994 | Ikata et al. | 310/313 R |
| 5,459,368 | 10/1995 | Onishi et al. | 310/313 R |
| 5,699,027 | 12/1997 | Tsuji et al. | 310/313 R X |

FOREIGN PATENT DOCUMENTS

| | | |
|---|---|---|
| 0 472 856 | 3/1992 | European Pat. Off. . |
| 0 527 468 | 2/1993 | European Pat. Off. . |
| 0 637 871 | 2/1995 | European Pat. Off. . |
| 4-360407 | 12/1992 | Japan ................ 310/313 R |
| 5-90873 | 4/1993 | Japan ................ 333/193 |
| 5-335878 | 12/1993 | Japan ................ 310/313 R |
| 6-97759 | 4/1994 | Japan ................ 310/313 R |
| 7-212180 | 8/1995 | Japan . |
| 7-336183 | 12/1995 | Japan . |

*Primary Examiner*—Robert Pascal
*Assistant Examiner*—Barbara Summons
*Attorney, Agent, or Firm*—Venable; Robert J. Frank; Allen Wood

[57] ABSTRACT

In a ceramic package for encapsulating a SAW (surface acoustic wave) filter, a metal pad is formed on the bottom of a recess formed in the package. A SAW filter chip is mounted to the package such that propagation paths formed on the chip face the bottom of the recess with the intermediary of a gap. The gap promotes easy impedance adjustment.

7 Claims, 6 Drawing Sheets

SAW FILTER ENCAPSULATED IN A CERAMIC PACKAGE WITH CAPACITANCE INCORPORATED THEREIN

BACKGROUND OF THE INVENTION

1. Field of the Invention

The present invention relates to a SAW (surface acoustic wave) filter encapsulated in a ceramic package, and a ceramic package therefor.

2. Description of the Background Art

It is a common practice with a ceramic package for encapsulating a SAW filter to form pads on one of its opposite major surfaces. A SAW filter chip or wafer chip is affixed to the package by adhesion or similar technology with its one major surface carrying a pattern of electrodes facing upward. The pattern of electrodes, i.e., electrode strips are connected to the pads of the package by bonding wires. A lid is mounted on the top of the package and sealed by solder. The electrodes are printed on a substrate of piezo-electric material, such as $LiTaO_3$.

The above-mentioned conventional ceramic package has a problem in that the adjustment of impedance is very difficult partly because the surface of the filter chip carrying the electrode pattern and facing upward is hermetically sealed in the package and partly because the electrode pattern itself is printed on $LiTaO_3$ or similar fragile material.

SUMMARY OF THE INVENTION

It is therefore an object of the present invention to provide a ceramic package for a SAW filter and capable of promoting easy adjustment of impedance.

A ceramic package for a SAW filter in accordance with the present invention includes a metal pad formed on the bottom of a recess formed in the ceramic package. A SAW filter chip is mounted to the ceramic package such that propagation paths formed on one of opposite major surfaces of the filter chip face the bottom of the recess via a gap.

In the above configuration, the ceramic package and SAW filter chip are connected to each other by bumps. A shoulder is formed in the recess and surrounds the SAW filter chip. A capacitance is thereby established between the metal pad and the propagation paths on the major surface of the SAW filter chip.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 11:
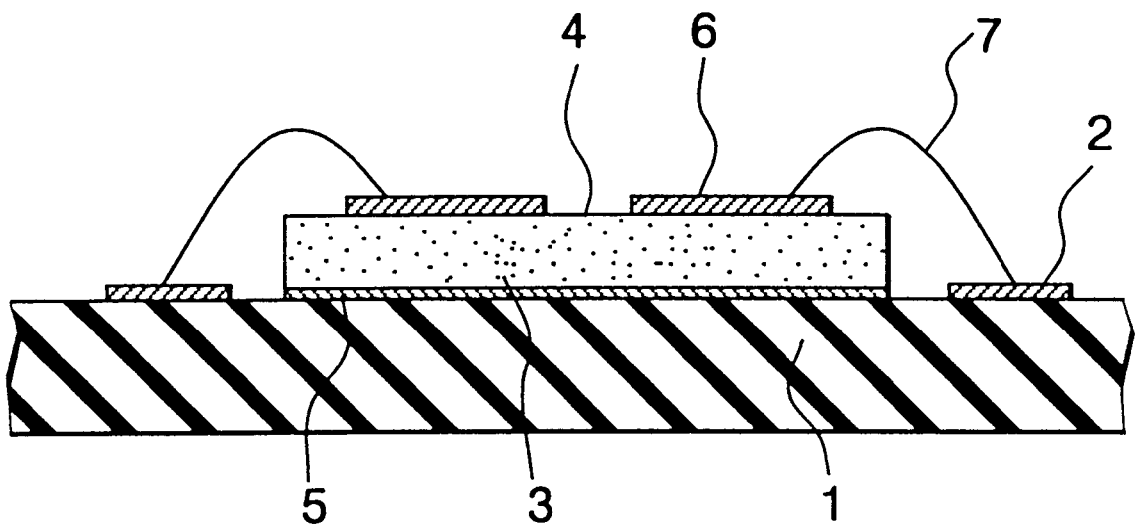
FIG. 11 is a section partially showing a conventional ceramic package and a SAW filter mounted thereon.

To better understand the present invention, a brief reference will be made to a conventional ceramic package for encapsulating a surface acoustic wave (SAW) filter, shown in FIG. 11. As shown, the package, generally designated with a reference numeral 1, has metal pads 2 formed on one of its opposite major surfaces. A SAW filter chip or wafer chip 3 is affixed to the package 1 by, e.g., adhesive 5 with its surface 4 carrying a pattern of electrodes facing upward. The electrode pattern, i.e., electrodes 6 are connected to the pads 2 of the package 1 by bonding wires 7. A lid, not shown, is mounted on the top of the package 1 and sealed by solder. The electrodes 6 are printed on a substrate of piezoelectric substance such as $LiTaO_3$.

The problem with the afore-mentioned conventional package 1 is that the adjustment of impedance is extensively difficult partly because, on one hand, the patterned surface 4 is hermetically sealed in the package 1 and, on the other hand, partly because the electrode pattern itself is printed on $LiTaO_3$ or similar fragile material, as stated earlier.

Figure 1A:
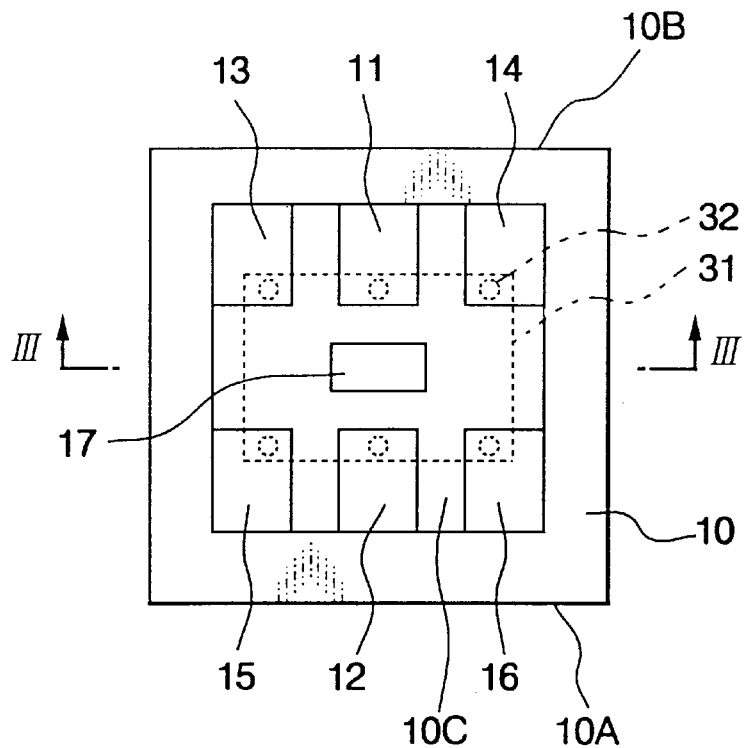
FIG. 1A is a plan view showing a ceramic package for encapsulating a SAW filter and embodying the present invention.
Figure 1B:
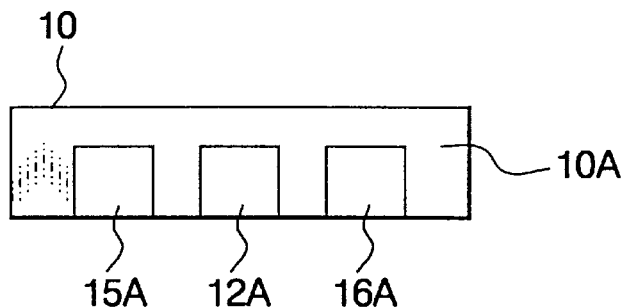
FIG. 1B is a front view of the package shown in FIG. 1A.
Figure 1C:
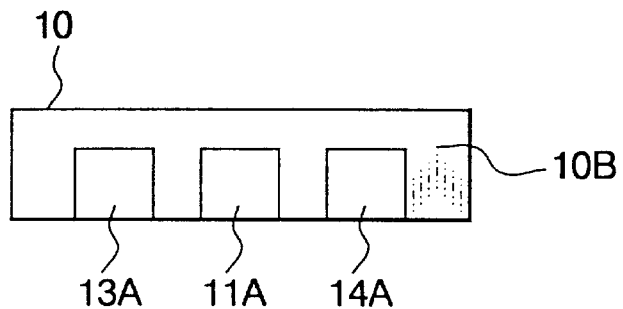
FIG. 1C is a rear view of the package shown in FIG. 1A.

Referring now to FIGS. 1A, 1B and 1C, a ceramic package for encapsulating a SAW filter in accordance with an embodiment of the present invention will be described. As shown in FIG. 1A, the package, generally designated with a reference numeral 10, is generally of a rectangular box shape. The package 10 includes an input terminal 11, an output terminal 12, and four ground terminals 13–16 formed in a recess 10C cut therein. The ground terminals are to be connected to ground. As shown in FIG. 1B, the output terminal 12 and ground terminals 15 and 16 are respectively connected to terminal pads 12A, 15A and 16A, which are formed on one or front side face 10A of the package 10. Likewise, as seen from FIG. 1C, the input terminal 11 and ground terminals 13 and 14A are respectively connected to other terminal pads 11A, 13A and 14, which are also formed on another side, or rear face 10B of the package 10 opposite to the front side face 10A.

A generally rectangular pad 17 is formed of metal and positioned on the generally flat bottom 10D of the recess 10C (see FIG. 3) formed in the package 10. The metal pad 17 is surrounded by the input terminal 11, output terminal 12, and ground terminals 13–16 as depicted. It is to be noted that the pad 17 may be provided with any desired shape and may be located at any desired position on the bottom surface 10D of the package 10 shown in FIG. 1A. In FIG. 1A, a SAW filter chip 31 and bumps 32 to which the filter chip 31 is connected are indicated by phantom lines. How to support the chip 31 by the bumps 32 will be described later.

Figure 2:
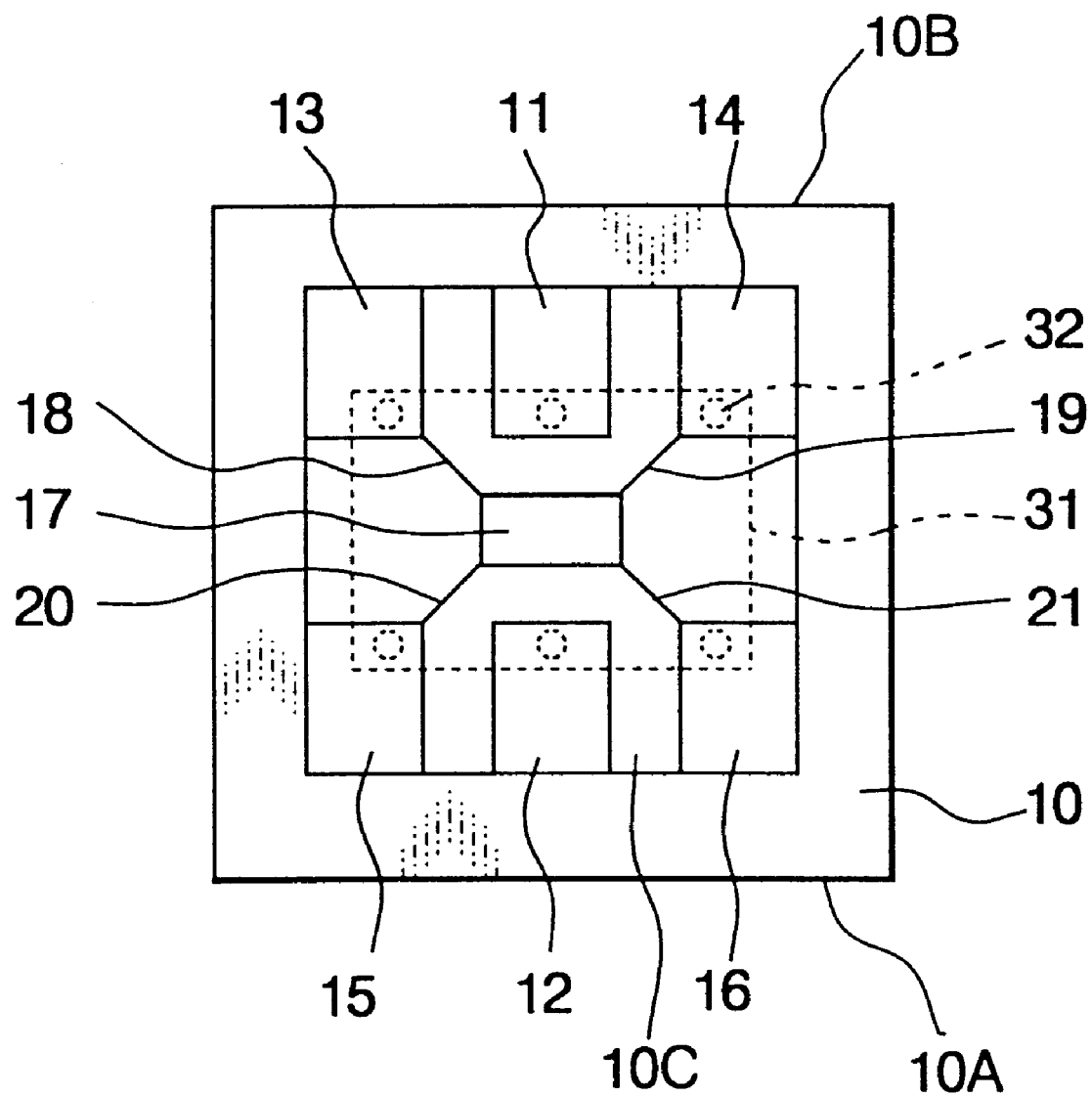
FIG. 2 is a plan view, similar to FIG. 1, showing an alternative embodiment of a ceramic package in accordance with the present invention.

FIG. 2 shows an alternative embodiment of the present invention. In FIG. 2, the structural elements like those shown in FIGS. 1A, 1B and 1C are designated by the same reference numerals, and a detailed description thereof will not be made in order to avoid redundancy. As shown, this embodiment may be the same as what is shown in and described with reference to FIGS. 1A, 1B and 1C except that with the FIG. 2 embodiment the metal pad 17 is connected to the ground terminals 13–16 by connections, such as wires or metal strips, 18–21, respectively.

Figure 3:
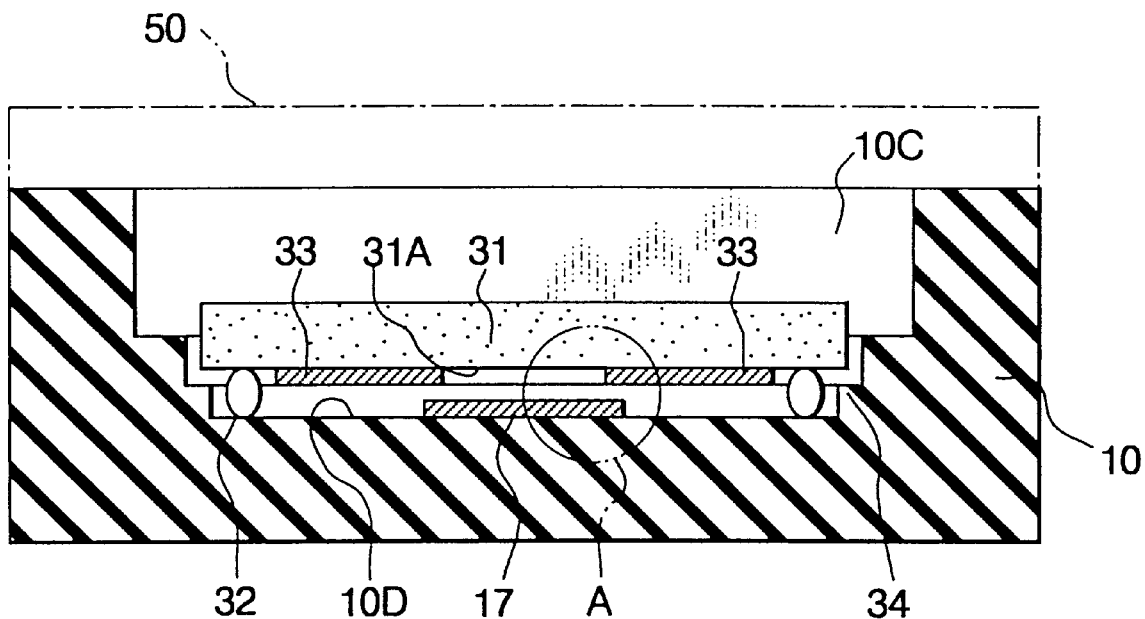
FIG. 3 shows a section of the package of the embodiment shown in FIGS. 1A, 1B and 1C, cut along a dot-and-chain line III—III in FIG. 1A, together with a SAW filter mounted thereon.
Figure 4:
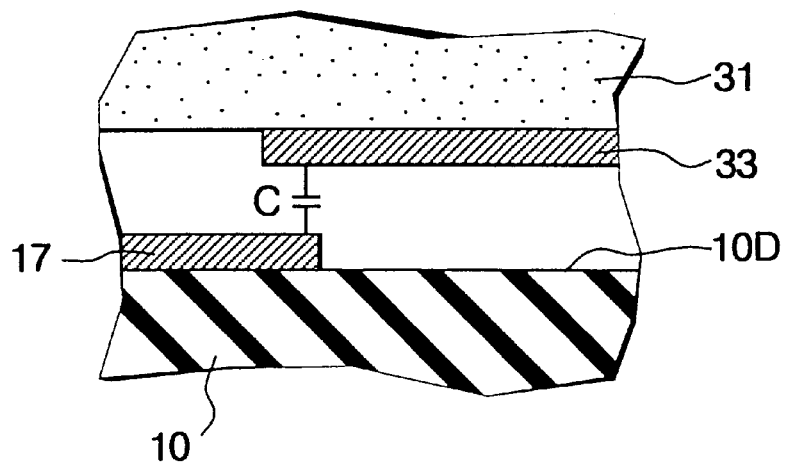
FIG. 4 is a fragmentary, enlarged view of a portion designated with a circle A included in the assembly shown in FIG. 3.

How the SAW filter chip 31 is mounted to the ceramic package 10 shown in FIGS. 1A–1C will be described with reference to FIGS. 3 and 4. As shown in FIG. 3, the filter chip 31 is mounted to the package 10 face down, i.e., with one of its primary surface 31A carrying electrode patterns 33 facing downward in the figure. The filter chip 31 is connected to the bottom surface 10D of the package 10 by the bumps 32. The package 10 includes a shoulder 34 for forming an appropriate air gap between the electrode pattern or propagation paths 33 of the filter chip 31 and the pad 17 of the package 10. The shoulder 34 has a height, as measured from the bottom 10D of the recess 10C formed in the package 10, so selected as not to affect the connection using the bumps 32. The electrode pattern or propagation paths 33 are printed on the primary surface 31A of the chip 31 in the form of metal, comb-like strips, for example, which are adapted to propagate surface acoustic waves over the surface of the piezoelectric substrate 31 along the paths 33.

A lid, shown with a phantom line 50, FIG. 3, is fitted on the top of the recess 10C of the package 10 in order to seal the package 10. In this configuration, as imaginarily shown in FIG. 4, a capacitance C is produced between the propagation paths 33 of the filter chip 31 and the pad 17 of the package 10 due to the above-mentioned gap. By adjusting the height of the bumps 32 to vary the capacitance C, it is possible to control the impedance and phase of the propagation paths 33. This is also true with the alternative embodiment shown in FIG. 2.

Figure 5:
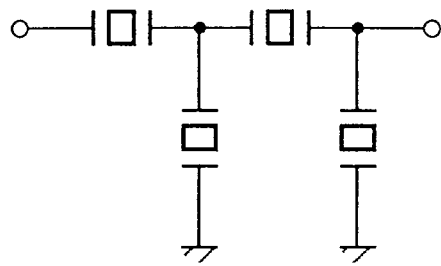
FIG. 5 shows an equivalent circuit to a SAW filter encapsulated in a conventional ceramic package.
Figure 6:
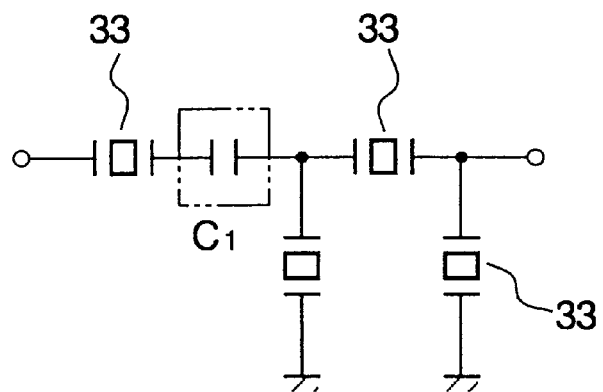
FIGS. 6, 7 and 8 are equivalent circuit diagrams, similar to FIG. 5, each showing part of a specific circuit configuration available with the SAW filter encapsulated in the package of FIGS. 1A, 1B and 1C.
Figure 7:
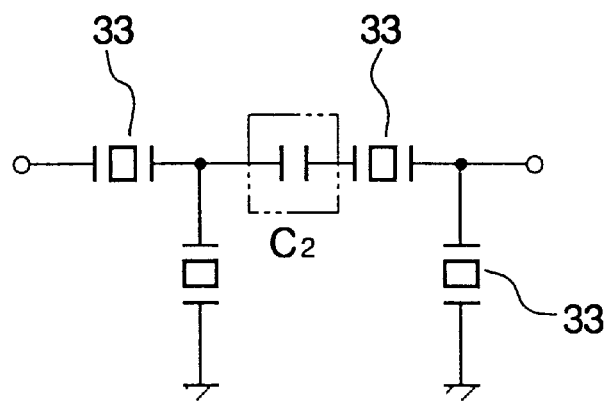
Figure 8:
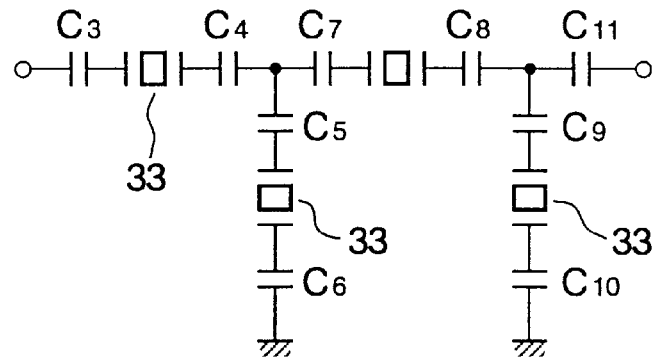

Assume that a three-stage SAW filter is mounted on a conventional ceramic package by way of example. Then, the SAW filter encapsulated in the package in the conventional way is usually represented by an equivalent circuit shown in FIG. 5. It is noted that a capacitance is not formed in the circuitry. By contrast, when such a SAW filter is now mounted on the ceramic package of the type shown in FIGS. 1A, 1B and 1C, a capacitance or capacitances can be added, as shown in FIG. 6, 7 or 8. Specifically, a capacitance $C_1$ (FIG. 6), a capacitance $C_2$ (FIG. 7) or capacitances $C_3$–$C_{11}$ (FIG. 8) can be added, as desired, by appropriately providing, positioning and shaping the metal pads 17, as well as adjusting the height of the bumps 32. The application shown in FIG. 8 is of a maximum number of capacitances available with this specific circuit configuration. With the FIG. 8 application, the capacitances $C_3$, $C_4$, $C_5$, $C_7$, $C_8$, $C_9$ and $C_{11}$ are inserted in serial to the propagation paths 33. The remaining capacitances $C_6$, and $C_{10}$ have one electrodes thereof grounded, established by grounding metal pads 17 by connection wires 18, 19, 20 and 21 to the ground terminal 12, 14, 15 and 16, as shown in FIG. 2.

Figure 9:
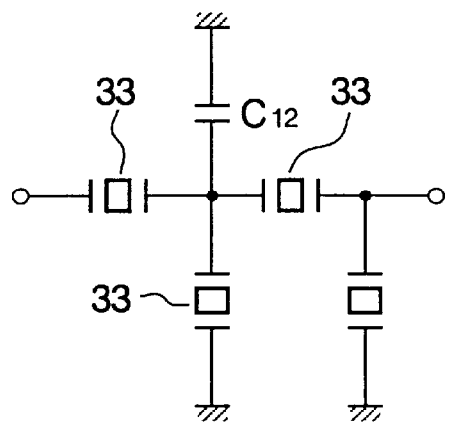
FIGS. 9 and 10 are equivalent circuit diagrams, similar to FIG. 5, each showing part of a specific configuration available with the SAW filter included in the package shown in FIG. 2.
Figure 10:
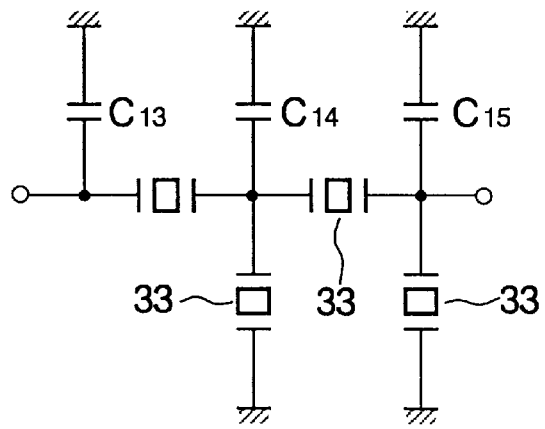

Likewise, as shown in FIG. 9, when the above filter is mounted on the ceramic package 10 of the type shown in FIG. 2, a capacitance $C_{12}$ can be added in a parallel connection. Alternatively, as shown in FIG. 10, capacitances $C_{13}$, $C_{14}$ and $C_{15}$ may be added in a plurality of parallel connections. In any case, the capacitance or capacitances allow the impedance of the SAW filter encapsulated in the package to be varied and thereby allow the frequency of the filter to appropriately be adjusted. Moreover, because the patterned surface of the filter chip 31 faces downward, namely directed to the bottom 10D, it is protected from solder which may fly in the event of sealing of the package.

In summary, it will be seen that the present invention provides a ceramic package for encapsulating a SAW filter and having various unprecedented advantages, as follows. Because the package includes a metal pad, a capacitance can be varied with ease on the basis of the shape of the pad. As a result, the impedance and phase of propagation paths can be varied, as desired. Further, bumps allow a SAW filter chip to be readily mounted to the package and reduce the cost of the package. Moreover, a shoulder formed in the recess of the package and surrounding the filter chip further promotes easy mounting of the chip and implements automated production. In addition, the capacitance added, to the packaged SAW filter varies the impedance and thereby allows the frequency of the SAW filter to be adjusted.

While the present invention has been described with reference to the particular illustrative embodiments, it is not to be restricted by the embodiments. It is to be appreciated that those skilled in the art can change or modify the embodiments without departing from the scope and spirit of the present invention. For example, while the illustrative embodiments have concentrated on a ceramic package for a SAW filter, they are similarly applicable to an RF (Radio Frequency) module using bumps if the chip wafer is replaced with a monolithic module.

What is claimed is:

1. An electrical component comprising:

an insulating package member having a flat surface region;

a conductive pad affixed to the flat surface region of the package member; and a chip having a flat surface with an electrode on it, the chip being mounted on the package member so that the flat surface of the chip faces the flat surface region of the package member and so that the electrode is spaced apart from the conductive pad, the electrode at least partially overlapping the conductive pad to capacitively couple the electrode and the conductive pad, wherein the package member has a shoulder adjacent the flat surface region of the package member, and wherein the chip has a peripheral edge that overlaps the shoulder.

2. An electrical component according to claim 1, wherein the chip additionally has another electrode on its flat surface, the another electrode being spaced apart from the conductive pad, and wherein the another electrode at least partially overlaps the conductive pad to capacitively couple the another electrode and the conductive pad.

3. An electrical component according to claim 1, wherein the package member has a recess with a bottom, the flat surface region of the package member being disposed at the bottom of the recess and the chip being disposed inside the recess.

4. An electrical component according to claim 3, wherein the package member comprises ceramic material.

5. An electrical component according to claim 1, wherein the chip is a surface acoustic wave chip.

6. An electrical component comprising:

an insulating package member comprising ceramic material, the package member having a flat surface region and a recess with a bottom, at which the flat surface region is disposed;

a conductive pad affixed to the flat surface region of the package member; and a chip having a flat surface with an electrode on it, the chip being mounted inside the recess of the package member so that the flat surface of the chip faces the flat surface region of the package member and so that the electrode is spaced apart from the conductive pad, the electrode at least partially overlapping the conductive pad to capacitively couple the electrode and the conductive pad; and a lid which is affixed to the package member and which closes the recess, wherein the package member has a shoulder within the recess and adjacent the flat surface region of the package member, and wherein the chip has a peripheral edge that overlaps the shoulder.

7. An electrical component according to claim 6, wherein the chip is a surface acoustic wave chip.

* * * * *